(12) United States Patent
Tanaka

(10) Patent No.: US 8,830,682 B2
(45) Date of Patent: Sep. 9, 2014

(54) ELECTRICAL CONNECTION DEVICE AND ELECTRONIC DEVICE INCLUDING THE SAME

(75) Inventor: Yosuke Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 409 days.

(21) Appl. No.: 13/235,582

(22) Filed: Sep. 19, 2011

(65) Prior Publication Data
US 2012/0113600 A1 May 10, 2012

(30) Foreign Application Priority Data
Nov. 9, 2010 (JP) ................................ 2010-250920

(51) Int. Cl.
*H05K 7/16* (2006.01)
(52) U.S. Cl.
USPC ........................................................... 361/725
(58) Field of Classification Search
USPC ........................................................... 361/725
See application file for complete search history.

(56) References Cited

U.S. PATENT DOCUMENTS

| | | | | |
|---|---|---|---|---|
| 6,699,128 B1* | 3/2004 | Beadell et al. | ................... | 463/46 |
| 6,926,548 B2* | 8/2005 | Reasoner et al. | ............. | 439/310 |
| 7,057,898 B2* | 6/2006 | Chen et al. | .................... | 361/725 |
| 7,193,856 B2* | 3/2007 | Hidaka | .......................... | 361/725 |
| 7,455,334 B2* | 11/2008 | Hisatomi et al. | ................. | 292/80 |
| 7,477,525 B2* | 1/2009 | Coutancier et al. | ........... | 361/801 |
| 8,172,594 B2* | 5/2012 | Brusaca et al. | ............... | 439/267 |
| 2005/0174743 A1* | 8/2005 | Downing et al. | ............. | 361/725 |

FOREIGN PATENT DOCUMENTS

| | | |
|---|---|---|
| EP | 0726699 | 8/1996 |
| JP | 5-29182 U | 4/1993 |
| JP | 6-195153 A | 7/1994 |
| JP | 8-221154 A | 8/1996 |
| JP | 2005-115935 A | 4/2005 |

* cited by examiner

*Primary Examiner* — Forrest M Phillips
(74) *Attorney, Agent, or Firm* — Fujitsu Patent Center

(57) ABSTRACT

An electronic device includes an enclosure, a side-plate to extend horizontally along a side surface of the enclosure, the side plate including a first horizontal guide, a second horizontal guide and a vertical guide extending vertically from an operating position of the first horizontal guide, a pivot lever to extend horizontally along the side plate, the pivot lever having a fulcrum being engaged with the second horizontal guide, an action point being engaged with the first horizontal guide and a force point, a lifter being engaged with the action point of the pivot lever upon the action point being at the operating position of the first horizontal guide, and a first connector to be disposed at an upper portion of the lifter and to be protruded from the enclosure upon the lifter being moved up by pivoting the pivot lever.

16 Claims, 15 Drawing Sheets

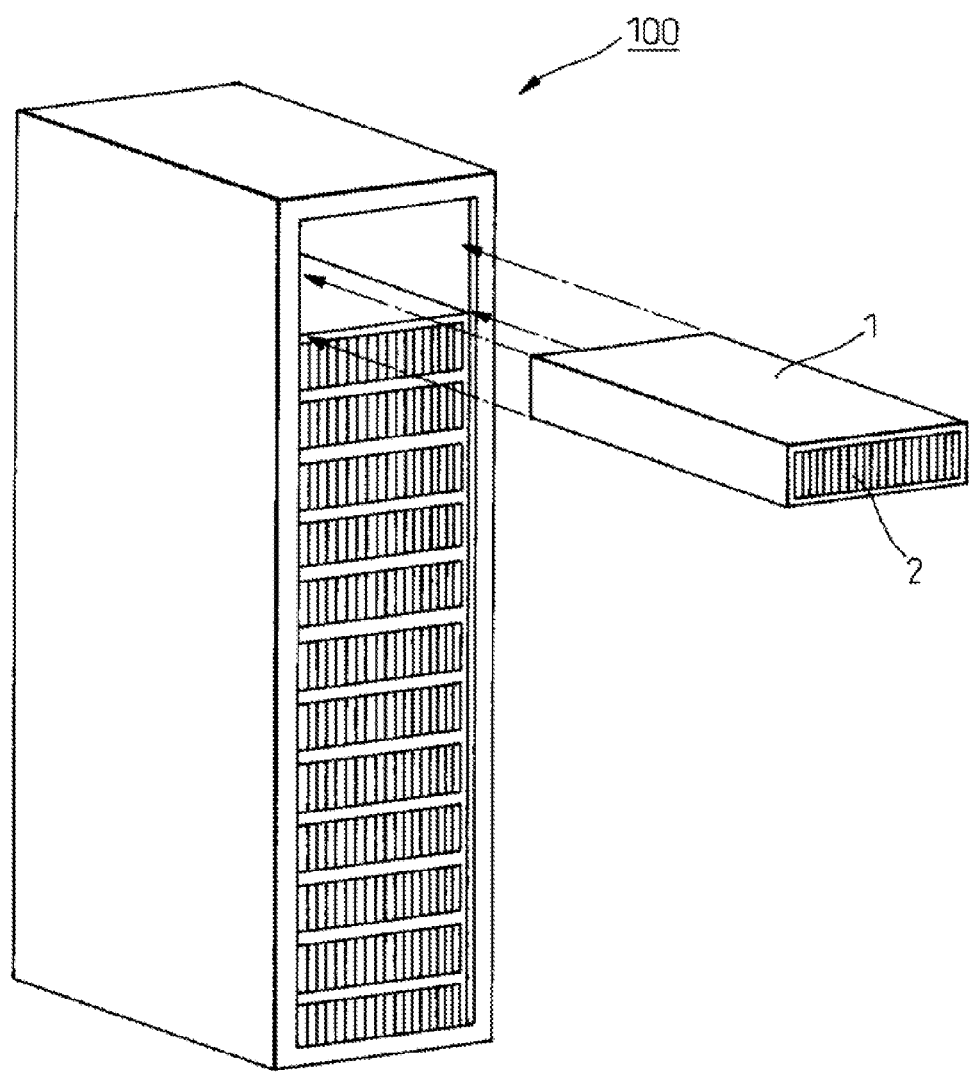

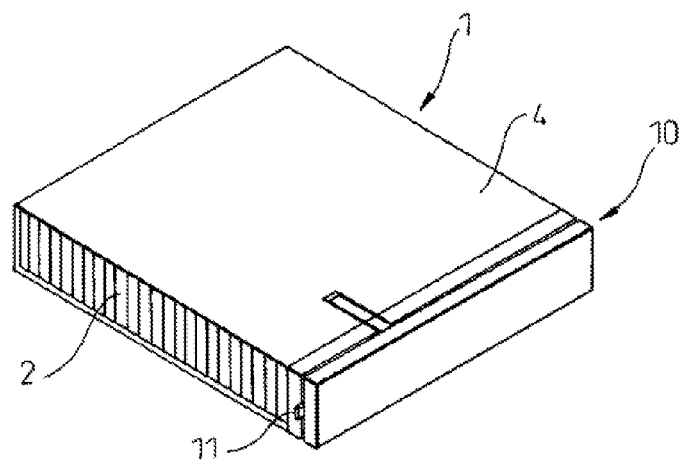
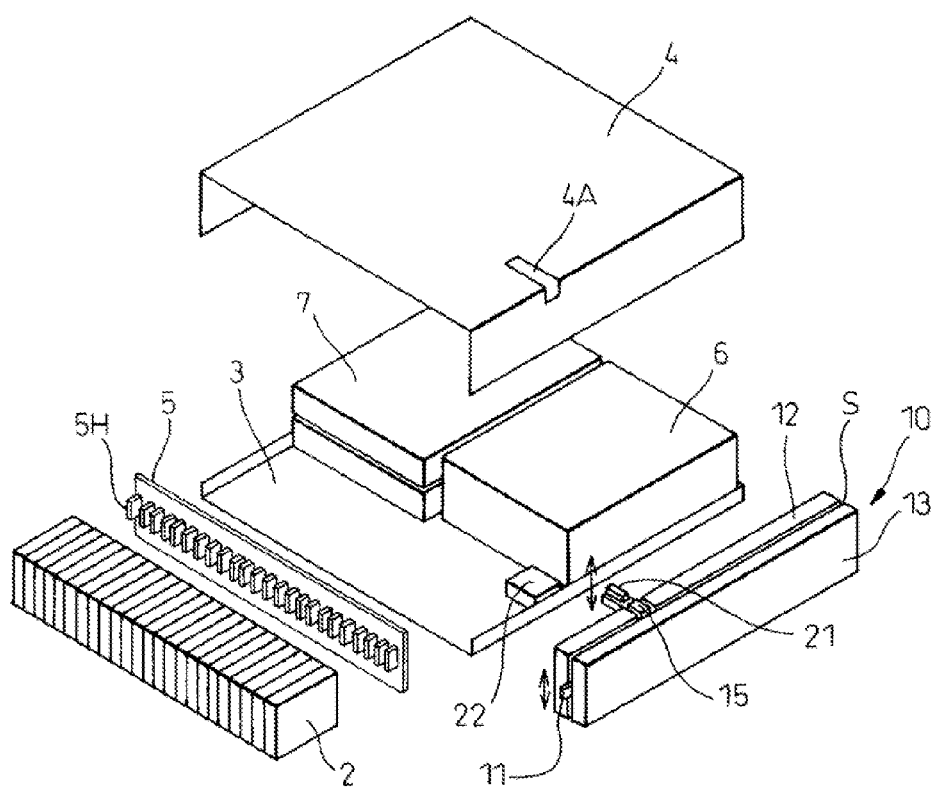

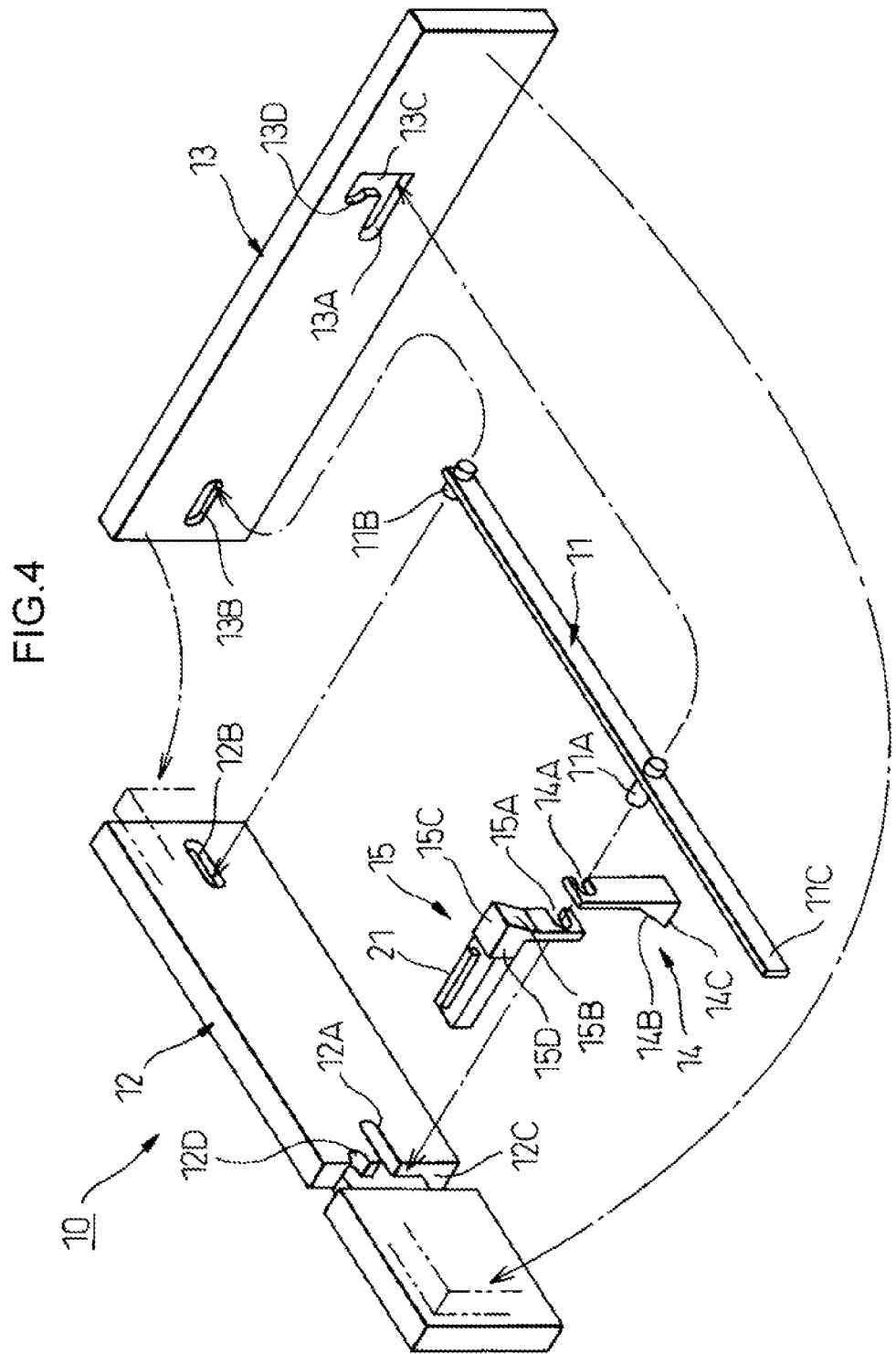

ELECTRICAL CONNECTION DEVICE AND ELECTRONIC DEVICE INCLUDING THE SAME

CROSS-REFERENCE TO RELATED APPLICATIONS

This application is based upon and claims the benefit of priority of the prior Japanese Patent Application No. 2010-250920, filed on Nov. 9, 2010, the entire contents of which are incorporated herein by reference.

FIELD

The embodiments discussed herein are related to an electronic device including an electrical connection device that interconnects electronic devices.

BACKGROUND

Nowadays, electronic devices serving as information terminals, for example, disk array devices that each includes a plurality of hard disk drives mounted therein and servers are vertically stacked in a system rack in use. Internal circuits of the vertically stacked electronic devices in the system rack are, in most cases, electrically connected to each other. When the electronic devices are connected to each other, connectors mounted on the front or rear surfaces of enclosures of the electronic devices are usually connected to each other using cables (refer to Japanese Laid-open Patent Publication No. 8-221154). Alternatively, a female connector and a male connector are respectively provided at positions opposing each other on an upper surface and on an lower surface of the electronic device so as to connect the female connector to the male connector when the electronic device and the other electronic device are stacked one on top of the other (refer to Japanese Laid-open Patent Publication No. 8-221154 and Japanese Laid-open Patent Publication No. 6-195153).

When cables are used to connect the connectors mounted in the front or rear surfaces of the enclosures of the electronic devices to each other in order to connect the electronic devices vertically stacked in the system rack, the length of each connection cable is set to a length longer than the minimum connection length. The connection cable needs to have a degree of extra length for allowing insertion or removal of the connectors when the bending radius of the cable and properties of the cable in wiring are considered.

In a structure in which female and male connectors are respectively provided at positions opposing each other on the upper and lower surfaces of the enclosure of the electronic devices so as to connect the female connector to the male connector when the electronic devices are stacked one on top of the other, the male connector protrudes from the uppermost upper surface or the lowermost lower surface. For this reason, the enclosure of the uppermost or lowermost electronic device has a structure different from that of the intermediate electronic device so as to prevent the male connector from protruding from the uppermost upper surface or the lowermost lower surface.

When internal circuits of vertically stacked electronic devices are connected to each other with cables, the number of the cables increases as the number of the stacked electronic devices increases, thereby increasing transmission distances of signals between the electronic devices. As a result, phenomena disadvantageous for performance such as voltage reduction and noise contamination occur. In addition, since components used in the electronic devices are increasingly densely mounted, the electronic devices need much cooling air flowing into the enclosures. However, when connection cables are routed on the front or rear surfaces of the enclosures, there is a problem in that the cables block the flow of cooling air, thereby decreasing cooling capacity.

When circuits of vertically stacked electronic devices are directly connected to each other using female and male connectors, the structure of the enclosure needs be changed so as to prevent the male connector from protruding from the upper surface of the uppermost enclosure or the lower surface of the lowermost enclosure. Furthermore, the circuits of the vertically stacked electronic devices are all connected to each other using the connectors. This does not allow the circuitry in the enclosure disposed at an intermediate location to be unconnected.

SUMMARY

According to an aspect of the invention, an electronic device includes an enclosure configured to house a circuit board, the enclosure having a first opening of an upper portion thereof and a second opening of a lower portion thereof, a side-plate configured to extend horizontally along a side surface of the enclosure, the side plate including a first horizontal guide having a non-operating position and an operating position, a second horizontal guide having a non-operating position and an operating position, and a vertical guide extending vertically from the operating position of the first horizontal guide, a pivot lever configured to extend horizontally along the side plate, the pivot lever having a fulcrum, an action point and a force point, the fulcrum being engaged with the second horizontal guide and being movable between the non-operating position and operating position of the second horizontal guide in a horizontal direction, the action point being engaged with the first horizontal guide and being movable between the non-operating position and operating position of the first horizontal guide in a horizontal direction, the force point being positioned at one end portion of the pivot lever, a lifter configured to be movable upward and downward along the vertical guide, the lifter being engaged with the action point of the pivot lever when the action point of the pivot lever is moved to the operating position of the first horizontal guide and the fulcrum of the pivot lever is moved to the operating position of the second horizontal guide, a first connector configured to be disposed at an upper portion of the lifter and to be connected to the circuit board, the first connector moving upward to protrude from the first opening of the enclosure upon the pivot lever being engaged with the lifter and being pivoted from a horizontal position to move up the lifter, and a second connector configured to be disposed to expose at the second opening of the enclosure and to be connected to the circuit board, the second connector being connected to a first connector that is protruded from an enclosure of another electronic device, which has a structure the same as that of the electronic device, disposed immediately below the electronic device.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 1 is a perspective view illustrating a system rack that houses electronic devices.

FIG. 2A is a perspective view illustrating the appearance of an example of the electronic device including an electrical connection device housed in the system rack illustrated in FIG. 1 according to a first embodiment.

FIG. 2B is an exploded perspective view of the electronic device illustrated in FIG. 2A.

FIG. 4 is an exploded perspective view illustrating an internal structure of the electrical connection device illustrated in FIG. 3B.

DESCRIPTION OF EMBODIMENTS

Embodiments of the present application will be described in detail below in accordance with specific examples with reference to the accompanying drawings.

FIG. 1 illustrates a system rack 100 that houses electronic devices 1. In the system rack 100, a plurality of the electronic devices 1, for example, rack-mount disk array devices that each houses a plurality of hard disk drives are vertically stacked. The electronic devices 1 mounted in the system rack 100 are connected each other through cables or other electrically connecting members.

Figure 3A:
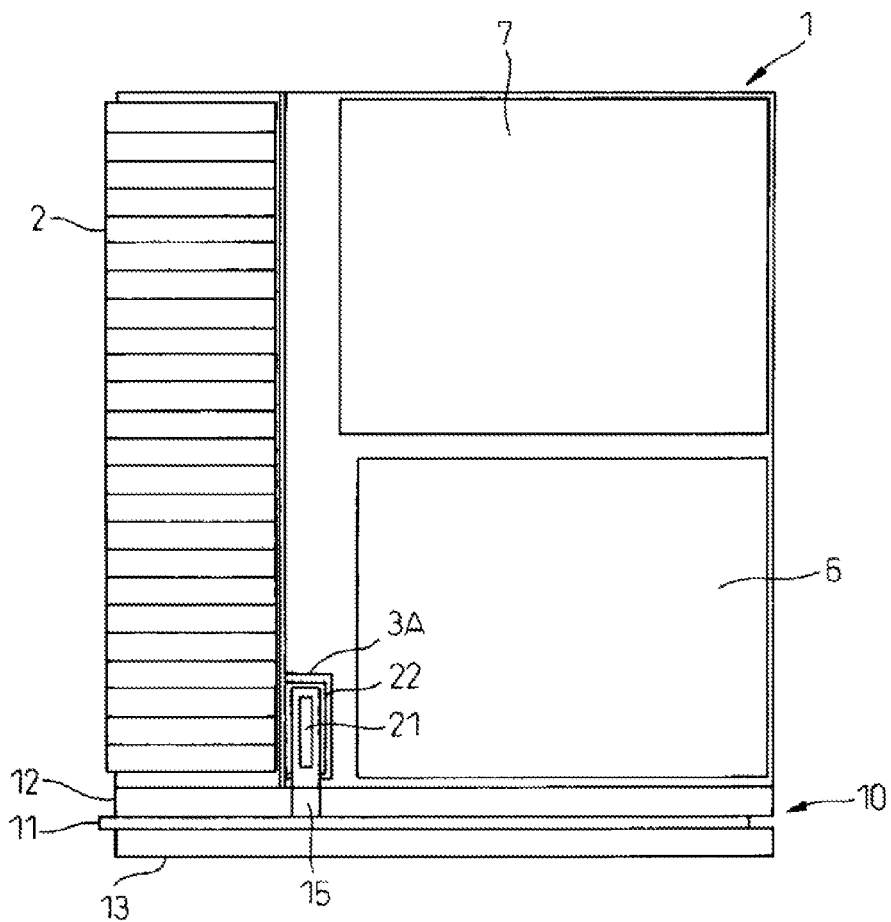
FIG. 3A is a plan view illustrating a state of the electronic device illustrated in FIG. 2A with an upper enclosure removed.
Figure 3B:
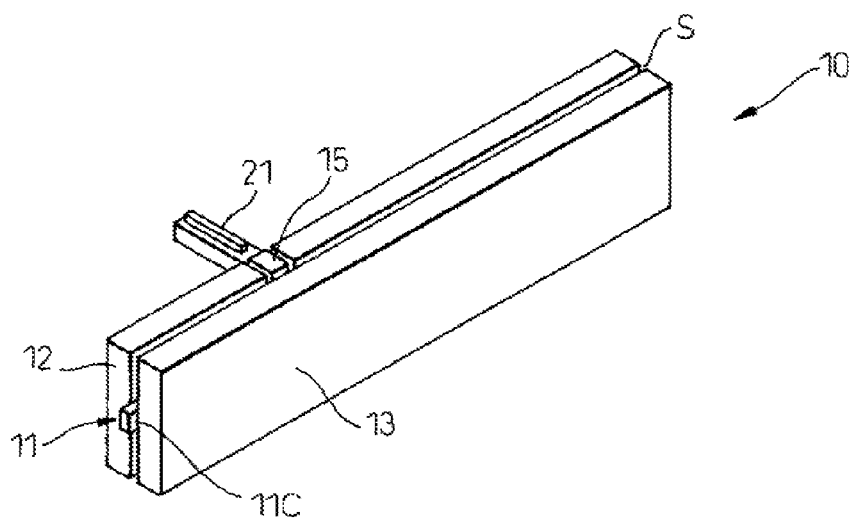
FIG. 3B is a perspective view illustrating in detail an overall structure of the electrical connection device illustrated in FIG. 2B.

FIG. 2A illustrates the appearance of an example of an electronic device 1 including an electrical connection device 10 housed in the system rack 100 illustrated in FIG. 1 according to a first embodiment. FIG. 2B is an exploded view of an internal structure of the electronic device 1 illustrated in FIG. 2A. FIG. 3A illustrates a state of the electronic device 1 illustrated in FIG. 2A with an upper enclosure 4 removed. FIG. 3B illustrates an overall shape of the electrical connection device 10 illustrated in FIG. 2B. The electronic device 1 of the present example includes a plurality of hard disk drives 2, a backplane 5 as an example of a circuit board, a power supply unit 6, a control unit 7, a male connector 21 as an example of a first connector and a female connector 22 as an example of a second connector disposed between the upper enclosure 4 and a lower enclosure 3, and the electrical connection device 10.

The backplane 5 is mounted on the lower enclosure 3 disposed in a width direction and perpendicular to the lower enclosure 3. The connectors 5H are disposed on a front surface side of the backplane 5 for mounting the plurality of hard disk drives 2. The female connector 22 is mounted on the lower enclosure 3, and the male connector 21 is retractable through an opening 4A formed in an upper part of the upper enclosure 4. Both the female connector 22 and the male connector 21 are connected to the backplane 5, although the detail, which will be described later, is omitted from the drawings here.

The electrical connection device 10 includes an inner plate 12 as an example of a side plate, an outer plate 13, and a pivot lever 11 that pivots in space S defined between the inner plate 12 and the outer plate 13 and moves up and down a second lifting member 15. The above-described male connector 21 is mounted on the second lifting member 15 such that, when the second lifting member 15 moves up or down, the male connector 21 accordingly moves up or down. A proximal end portion 11C of the pivot lever 11 protrudes from a front surface side of the electrical connection device 10. By operating the proximal end portion 11C of the pivot lever 11 in front of the electrical connection device 10, the male connector 21 may be moved up and down using the second lifting member 15.

Referring now to FIG. 4, the structure of the electrical connection device 10 of the present example in the space S defined between the inner plate 12 and the outer plate 13 is described. First, the structure of the pivot lever 11 is described. The pivot lever 11 of the present example has a fulcrum on a rear surface side of the electronic device 1, a force point on the front surface side of the electronic device 1, and an action point at the intermediate portion. For this reason, a pin 11B protrudes from both side surfaces of the pivot lever 11 in a portion of the pivot lever 11 corresponding to the fulcrum, and a pin 11A protrudes in a portion of the pivot lever 11 corresponding to the action point. The height of the pin 11B on the inner plate 12 side is the same as that on the outer plate 13 side. The pin 11A has the same height as that of the pin 11B on the outer plate 13 side, and the height thereof on the inner plate 12 side is higher than the height thereof on the outer plate 13 side so as to have a length sufficient to be engaged with a first lifting member 14 and the second lifting member 15 disposed at the inner plate 12 side of the pivot lever 11.

The inner plate 12 has a first horizontal groove 12A and a second horizontal groove 12B in a surface that opposes the pivot lever 11. The first horizontal groove 12A and the second horizontal groove 12B serve as horizontal guides in which the pin 11A and the pin 11B of the pivot lever 11 may be horizontally moved. Also in this surface that opposes the pivot lever 11, a vertical groove 12C serving as a vertical guide is formed so as to be connected to the first horizontal groove 12A. The first horizontal groove 12A is formed to have a deep depth corresponding to the length of the pin 11A, and the second horizontal groove 12B is formed to have a shallow depth corresponding to the length of the pin 11B. The upper and lower portions of the vertical groove 12C penetrate to a surface opposite the surface of the inner plate 12 that opposes the pivot lever 11. The first lifting member 14 and the second lifting member 15 are inserted into the vertical groove 12C. The vertical groove 12C has a lock groove 12D formed therein so as to stop the movement of the pin 11A.

The first lifting member 14 is a plate-like member and has in an upper portion thereof a pin insertion groove 14A into which the pin 11A is inserted. The lower portion of the first lifting member 14 has a tapered portion 14B that bulges toward a side opposite the pivot lever 11 side so as to increase the area of a lower surface 14C. The lower surface 14C of the first lifting member 14 is a pressure receiving surface that receives a pressure from the second lifting member 15, which is described later. When the pressure receiving lower surface 14C is flush with the lower surface of the inner plate 12, an opening of the pin insertion groove 14A faces an opening of the first horizontal groove 12A on the vertical groove 12C side.

The second lifting member 15 is also a plate-like member and has in a lower portion thereof a pin insertion groove 15A into which the pin 11A is inserted. The upper portion of the second lifting member 15 has a tapered portion 15B that bulges toward the pivot lever 11 side so as to increase the area of an upper surface 15C. A protrusion 15D is formed in a surface opposite the tapered portion 15B side. The above-described male connector 21 is mounted on the protrusion 15D. The upper surface 15C of the second lifting member 15 is a pressing surface that applies pressure to, when the other electrical connection device 10 having the same structure as the present electrical connection device 10 is disposed above the present electrical connection device 10, the pressure receiving lower surface 14C of the first lifting member 14 of the other electrical connection device 10 disposed above. When the second lifting member 15 is inserted into the vertical groove 12C, and the pressing upper surface 15C is flush with the upper surface of the inner plate 12, an opening of the pin insertion groove 15A faces an opening of the first horizontal groove 12A on the vertical groove 12C side. That is, the first lifting member 14 and the second lifting member 15 are inserted into the vertical groove 12C such that the first lifting member 14 and second lifting member 15 are adjacent to each other with the positions of the pin insertion groove 14A and the pin insertion groove 15A aligned in the horizontal direction.

The outer plate 13 which faces the inner plate 12 has a first horizontal groove 13A and a second horizontal groove 13B in a surface that opposes the pivot lever 11. The pin 11A and the pin 11B of the pivot lever 11 may be horizontally moved in the first horizontal groove 13A and the second horizontal groove 13B. Also in this surface, a vertical groove 13C is formed so as to be connected to the first horizontal groove 13A. The first horizontal groove 13A and the second horizontal groove 13B are formed to have a shallow depth corresponding to the lengths of the pin 11A and the pin 11B. The vertical groove 13C is formed in a portion above the first horizontal groove 13A, and a lower end portion thereof is communicated with an end of the first horizontal groove 13A. The vertical groove 13C has a lock groove 13D formed therein. The pin 11A is inserted into the lock groove 13D, which stops the movement of the pin 11A.

The first horizontal groove 13A, the second horizontal groove 13B, and the lock groove 13D are respectively positioned so as to directly oppose the first horizontal groove 12A, the second horizontal groove 12B, and the lock groove 12D of the inner plate 12 when the inner plate 12 and the outer plate 13 face each other. The electrical connection device 10 becomes a state illustrated in FIG. 3B by inserting the first lifting member 14 and the second lifting member 15 into the vertical groove 12C and by respectively inserting the pin 11A and the pin 11B of the pivot lever 11 into the first horizontal grooves 12A and 13A and the second horizontal grooves 12B and 13B so as to make the inner plate 12 and the outer plate 13 face each other. In this state, even when the pivot lever 11 is pushed back as much as possible, the proximal end portion 11C of the pivot lever 11 protrudes outward from end surfaces of the inner plate 12 and the outer plate 13.

As described above with reference to FIG. 4, when the pins 11A of the pivot lever 11 is inserted into the first horizontal grooves 12A and 13A, and pins 11B of the pivot lever 11 is inserted into the second horizontal grooves 12B and 13B, the pins 11A and 11B of the pivot lever 11 are not engaged with the first and second lifting members 14 and 15. In this state, although the pivot lever 11 may move in a front-rear direction of the electrical connection device 10, the pivot lever 11 may not move in an up-down direction of the electrical connection device 10. That is, the pivot lever 11 may not pivot, and the first lifting member 14 is freely movable in the up-down direction relative to the second lifting member 15 until the first lifting member 14 contacts the tapered portion 15B of the second lifting member 15.

Figure 5A:
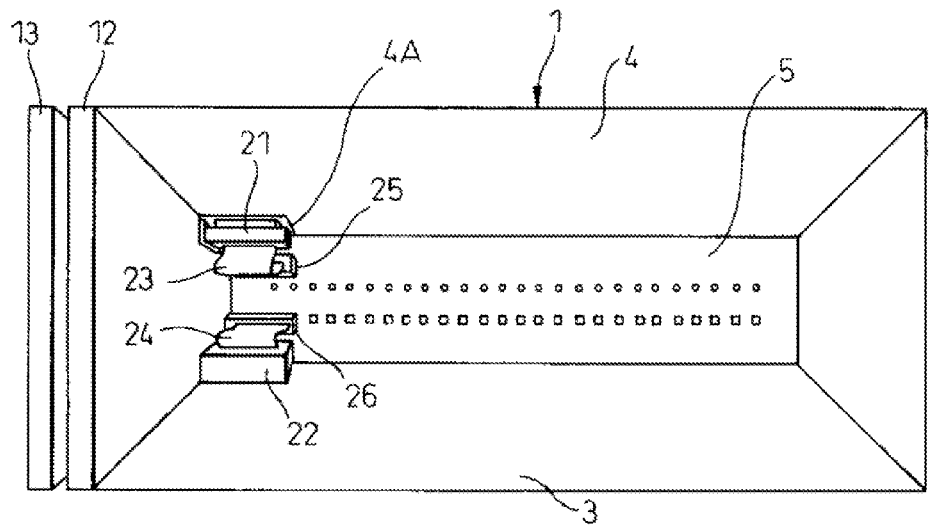
FIG. 5A is a perspective view illustrating connection of female and male connectors illustrated in FIG. 2B to the electronic device seen from a rear surface side of the electronic device with other components omitted from the figure.
Figure 5B:
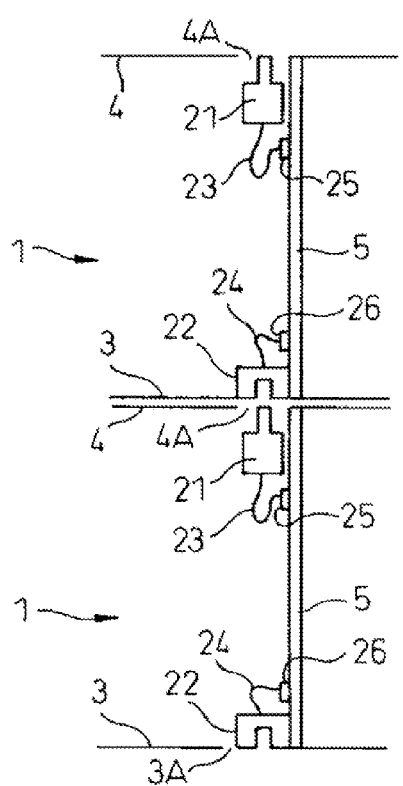
FIG. 5B is a schematic diagram illustrating the connection of the female and male connectors illustrated in FIG. 5A to the electronic device.

FIG. 5A illustrates connection of the female and male connectors 22 and 21 illustrated in FIG. 2B to the electronic device 1 seen from the rear surface side of the electronic device 1 with other components omitted from the figure. FIG. 5B schematically illustrates the connection of the female and male connectors 22 and 21 illustrated in FIG. 5A to the electronic device 1. The lower enclosure 3, the upper enclosure 4, the backplane 5, the inner plate 12, and the outer plate 13 are illustrated in these figures among others. As described above with reference to FIG. 4, the male connector 21 is mounted on the second lifting member 15 and positioned immediately below the opening 4A of the upper enclosure 4. The male connector 21 is connected to a flexible printed circuit (FPC) cable connector 25 mounted on the backplane 5 using an FPC 23. The length of the FPC 23 is set to a length having an extra length (looseness) so as not to apply tension to the FPC 23 even when the male connector 21 moves upward.

The female connector 22 is secured to the backplane 5 and connected to an FPC connector 26 mounted on the backplane 5 using an FPC 24. As illustrated in FIG. 5B, an opening 3A is formed at a position of the lower enclosure 3 immediately below the female connector 22 so as to expose a receiving portion of the female connector 22 that is connected to the male connector 21 at a lower surface of the lower enclosure 3. The female connector 22 may be mounted on a board different from the backplane 5, or may be directly secured to the lower enclosure 3. In a case in which the female connector 22 is secured to the backplane 5, the FPC 24 and the FPC connector 26 may not be provided if terminals that connect the female connector 22 to circuitry on the backplane 5 are provided.

As described above with reference to FIG. 4, when the pins 11A and 11B of the pivot lever 11 are moved in the first horizontal grooves 12A and 13A and the second horizontal grooves 12B and 13B, and the pivot lever 11 is pulled frontward, the pin 11A of the pivot lever 11 is engaged with the first and second lifting members 14 and 15. That is, the pin 11A of the pivot lever 11 is simultaneously inserted into the pin insertion groove 14A of the first lifting member 14 and the pin insertion groove 15A of the second lifting member 15, thereby connecting the first lifting member 14 to the second lifting member 15 using the pin 11A. In this state, by pulling upward the proximal end portion 11C of the pivot lever 11, the pivot lever 11 pivots about the pin 11B as the fulcrum, and the first and second lifting members 14 and 15 are moved upward in the vertical groove 12C by the pin 11A. This moves the male connector 21 upward.

Figure 5C:
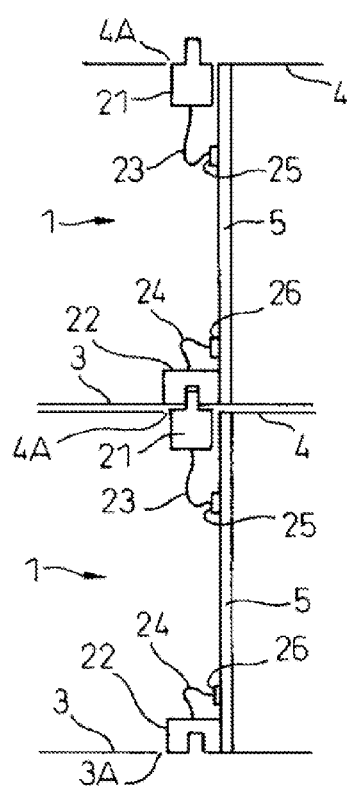
FIG. 5C illustrates an operation in which the male and female connectors illustrated in FIG. 5B are connected to each other.

FIG. 5C illustrates a state in which the male connector 21 is moved upward by upward pivoting the pivot lever 11. As illustrated in FIG. 5C, when the electronic devices 1 are stacked one on top of the other, the male connector 21 protrudes from the opening 4A of the upper enclosure 4 so as to be connected to the female connector 22 of the other electronic device 1 disposed above. As a result, the circuits on the backplanes 5 of the stacked electronic devices 1 are connected to each other.

Here, four states of the pivot lever 11 and the first and second lifting members 14 and 15 of the electrical connection device 10 of the present application are described with reference to FIGS. 6A to 6D, 7A to 7C, and 8A to 8D. FIGS. 6A to 6D are side views of the electrical connection device 10. FIGS. 7A to 7C illustrate connection relationships between the pivot lever 11 and the first and second lifting members 14 and 15 seen from the front side of the electronic device 1. FIGS. 8A to 8D illustrate connection relationships between the pin 11A of the pivot lever 11 and the first and second lifting members 14 and 15. It is noted that in FIGS. 6A to 6C, the pins 11A and 11B, the first horizontal grooves 12A and 13A, the second horizontal grooves 12B and 13B, and the lock groove 12D are all drawn in solid lines. It is also noted that FIGS. 7A to 7D each illustrate a state in which the electronic devices 1 are stacked one on top of the other, and out of the electrical connection device 10 of the electronic device 1 disposed below, only an upper portion of the second lifting member 15 is illustrated. The pin 11A of the pivot lever 11 has an elliptic cylindrical shape.

Figure 6A:
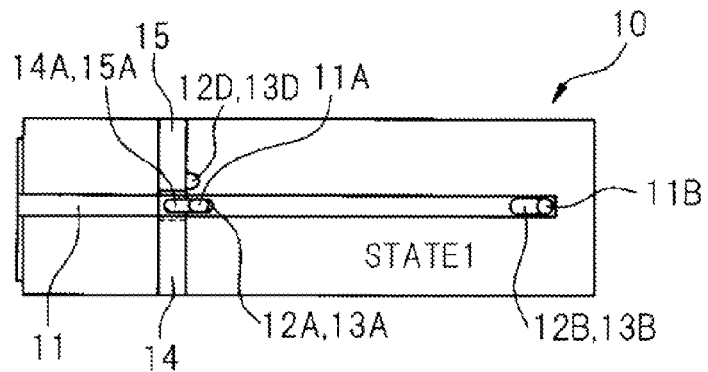
FIG. 6A is a side view illustrating STATE 1 of the electrical connection device of the present application.
Figure 7A:
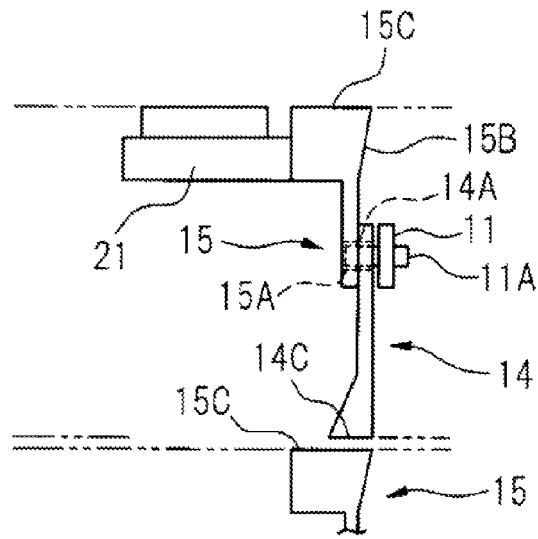
FIG. 7A is an enlarged view of a connection relationship between a pivot lever and lifting members of electrical connection device of the present application in STATE 1 and STATE 2 illustrated in FIGS. 6A and 6B seen from a front side of the electronic device.
Figure 7B:
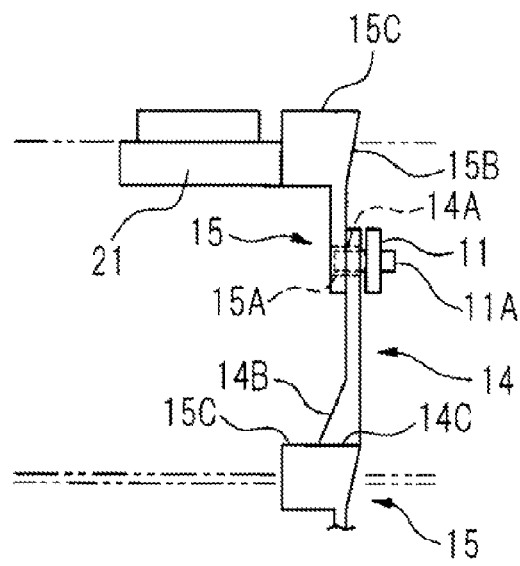
FIG. 7B is an enlarged view of a connection relationship between the pivot lever and the lifting members in STATE 3 illustrated in FIG. 6C seen from a front side of the electronic device.
Figure 7C:
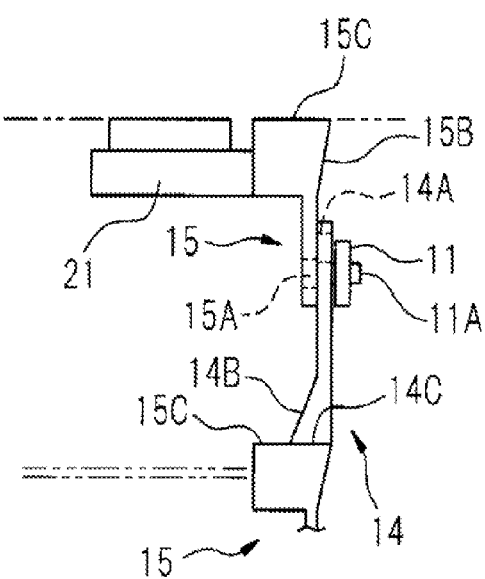
FIG. 7C is an enlarged view of a connection relationship between the pivot lever and the lifting members of the electronic device illustrated in FIG. 6A seen from a front side of the electronic device when the electronic device in STATE 3 illustrated in FIG. 6C underlies the electronic device in STATE 1 illustrated FIG. 6A.
Figure 8A:
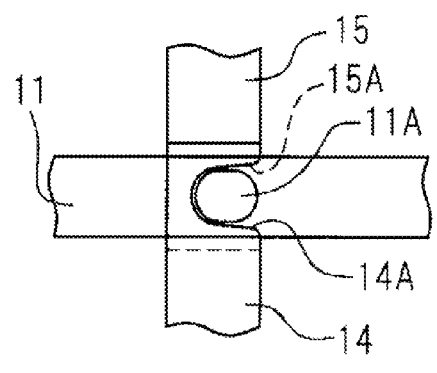
FIG. 8A is an enlarged view illustrating the connection relationship between the pivot lever and the first and second lifting members illustrated in FIG. 6B.
Figure 8B:
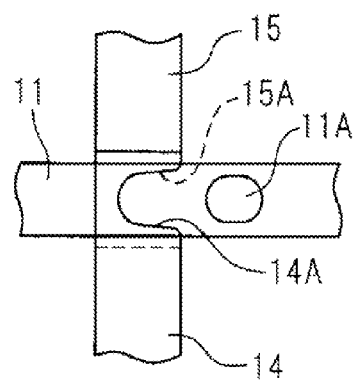
FIG. 8B is an enlarged view illustrating the connection relationship between the pivot lever and the first and second lifting members illustrated in FIG. 6A.

FIG. 6A illustrates STATE 1 in which the pivot lever 11 is pushed rearward into the electrical connection device 10, as an example of non-operating position. FIG. 7A illustrates the connection relationship between the pivot lever 11 and the first and second lifting members 14 and 15 at this time, and FIG. 8B illustrates the connection relationship between the pivot lever 11 and the first and second lifting members 14 and 15 at this time. In STATE 1, the first and second lifting members 14 and 15 are not connected. Thus, the first lifting member 14 may move relative to the second lifting member 15.

Figure 6B:
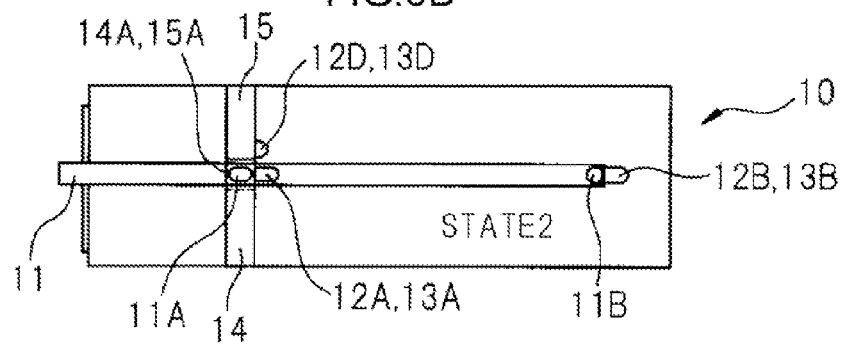
FIG. 6B is a side view illustrating STATE 2 of the electrical connection device of the present application.

FIG. 6B illustrates STATE 2 in which the pivot lever 11 is pulled frontward from the electrical connection device 10 as much as possible, as an example of operating position. FIG. 7A illustrates the connection relationship between the pivot lever 11 and the first and second lifting members 14 and 15 at this time, and FIG. 8A illustrates the connection relationship between the pin 11A of the pivot lever 11 and the first and second lifting members 14 and 15 at this time. In STATE 2, the pin 11A of the pivot lever 11 is inserted into the pin insertion groove 14A of the first lifting member 14 and the pin insertion groove 15A of the second lifting member 15. Thus, the first and second lifting members 14 and 15 are connected to each other with the pin 11A of the pivot lever 11.

Figure 6C:
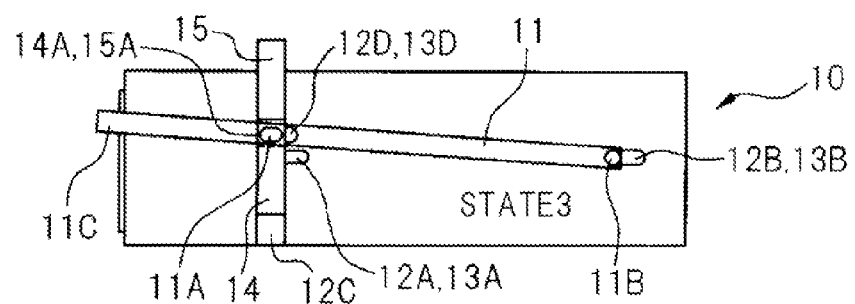
FIG. 6C is a side view illustrating STATE 3 of the electrical connection device of the present application.
Figure 8C:
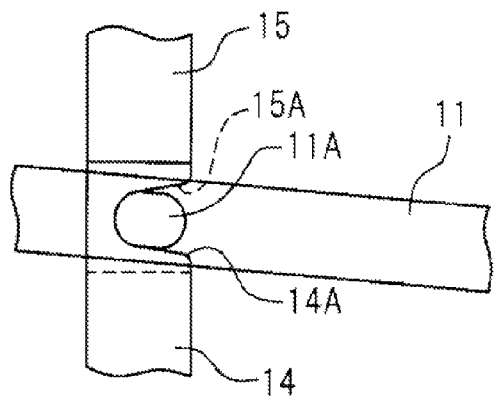
FIG. 8C is an enlarged view illustrating the connection relationship between the pivot lever and the first and second lifting members illustrated in FIG. 6C.

FIG. 6C illustrates STATE 3, in which the proximal end portion 11C of the pivot lever 11 is pulled upward relative to the electrical connection device 10 compared to STATE 2. The pivot lever 11 pivots about the pin 11B as the fulcrum. FIG. 7B illustrates the connection relationship between the pivot lever 11 and the first and second lifting members 14 and 15 at this time, and FIG. 8C illustrates the connection relationship between the pin 11A of the pivot lever 11 and the first and second lifting members 14 and 15 at this time. In STATE 3, since the first and second lifting members 14 and 15 are connected to each other with the pin 11A of the pivot lever 11 in STATE 2, the first and second lifting members 14 and 15 move upward together when the pivot lever 11 is turned upward.

Figure 6D:
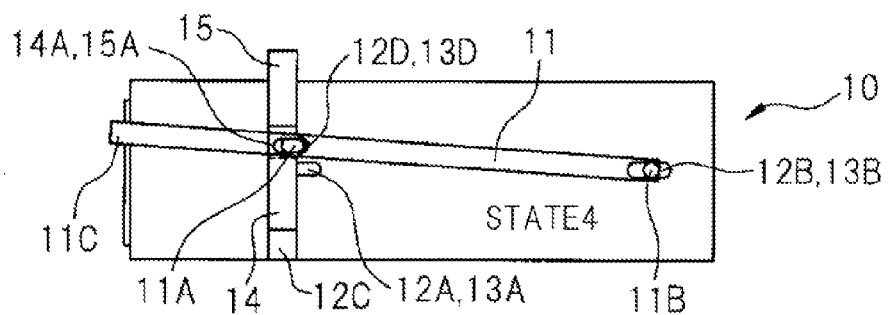
FIG. 6D is a side view illustrating STATE 4 of the electrical connection device of the present application.
Figure 8D:
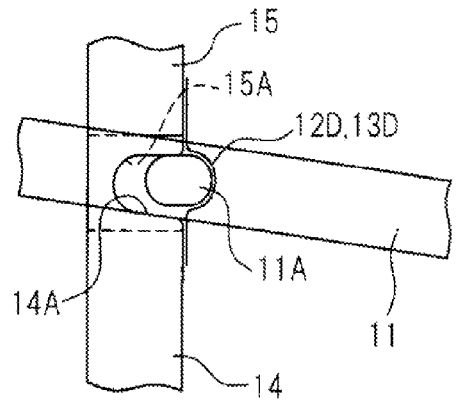
FIG. 8D is an enlarged view illustrating the connection relationship between the pivot lever and the first and second lifting members illustrated in FIG. 6D.

FIG. 6D illustrates STATE 4, in which the proximal end portion 11C of the pivot lever 11 is pushed into the electrical connection device 10 compared to STATE 3. When the pivot lever 11 is pushed into the electrical connection device 10 in STATE 3, a substantially half portion of the elliptic cylinder-shaped pin 11A is inserted into the lock grooves 12D and 13D. FIG. 7B illustrates the connection relationship between the pivot lever 11 and the first and second lifting members 14 and 15 at this time, and FIG. 8D illustrates the connection relationship between the pin 11A of the pivot lever 11 and the first and second lifting members 14 and 15 at this time. In STATE 4, since the substantially half portion of the elliptic cylinder-shaped pin 11A is inserted into the lock grooves 12D and 13D, the first and second lifting members 14 and 15 are connected to each other with the other half portion of the pin 11A. Thus, the pivot lever 11 and the first and second lifting members 14 and 15 are secured to this position in STATE 4.

Here, assume that the electronic device 1 including the electrical connection device 10 in STATE 1 is stacked on top of the electronic device 1 including the electrical connection device 10 in STATE 2 illustrated FIG. 6B. Then, assume that the state of the electronic device 1 in STATE 2 is changed to STATE 3. As described above, the second lifting member 15 protrudes from an upper surface of the electrical connection device 10 in STATE 3. In the electrical connection device 10 in STATE 1, the first lifting member 14 may move relative to the second lifting member 15. FIG. 7C illustrates a state in which the first lifting member 14 moves relative to the second lifting member 15. Thus, by setting the electronic device 1 disposed at the uppermost location in the system rack 100 to STATE 1, the second lifting member 15 and the male connector 21 do not protrude from the upper surface of the uppermost electronic device 1 even when the other electronic device 1 immediately below is set to STATE 3. Referring next to FIG. 9, this will further described with an example of electrical connection between the electronic devices 1 when the three electronic devices 1 are stacked one on top of the other.

Figure 9A:
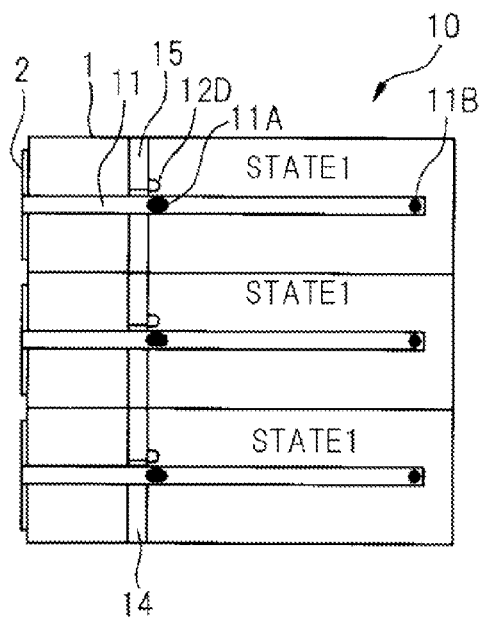
FIG. 9A is a side view illustrating a state in which the three electronic devices in STATE 1 are stacked one on top of the other in an electrical connection procedure for interconnecting the stacked three electronic devices.
Figure 9B:
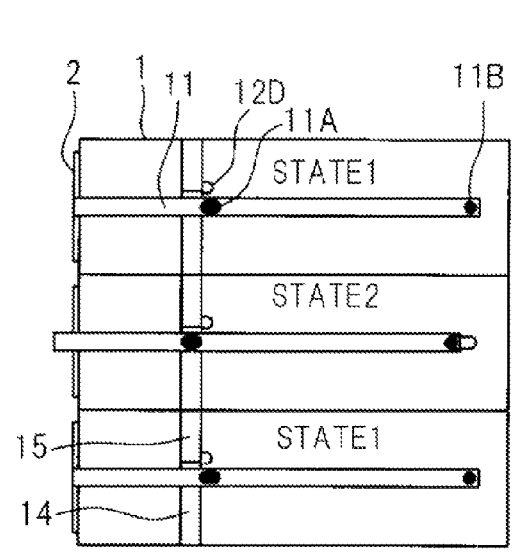
FIG. 9B is a side view illustrating a state in which the pivot lever of the electronic device at an intermediate location is pulled frontward so as to change the state of the intermediate device to STATE 2 from the state illustrated in FIG. 9A in the electrical connection procedure for interconnecting the stacked three electronic devices.

FIGS. 9A to 9D illustrate a procedure of electrical connection between the electronic devices 1 when the three electronic devices 1 that each includes the electrical connection device 10 of the present application are stacked one on top of the other. In order to stack the three electronic devices 1 one on top of the other and electrically connect the electronic devices 1 to each other, the three electronic devices 1 in STATE 1 are stacked as illustrated in FIG. 9A. Next, as illustrated in FIG. 9B, the pivot lever 11 of the electrical connection device 10 of the electronic device 1 in the intermediate location is pulled frontward so as to set the electrical connection device 10 to STATE 2.

Figure 9C:
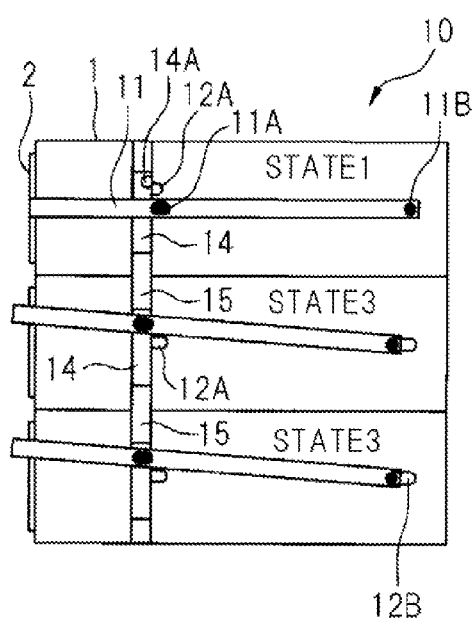
FIG. 9C is a side view illustrating a states of an uppermost and the intermediate electronic devices when the pivot lever of the lowermost electronic device is pulled frontward so as to change the state of the lowermost device to STATE 3 from the state illustrated in FIG. 9B in the electrical connection procedure for interconnecting the stacked three electronic devices.

After that, as illustrated in FIG. 9C, the pivot lever 11 of the electrical connection device 10 of the lowermost electronic device 1 is pulled frontward so as to set the lowermost electrical connection device 10 to STATE 2, and then turned upward so as to set the lowermost electrical connection device 10 to STATE 3. By this operation, the second lifting member 15 of the electrical connection device 10 of the lowermost electronic device 1 moves upward and pushes up the first lifting member 14 of the electrical connection device 10 of the intermediate electronic device 1. As a result, the second lifting member 15 connected to the first lifting member 14 of the electrical connection device 10 of the intermediate electronic device 1 moves upward and pushes upward the first lifting member 14 of the electrical connection device 10 of the uppermost electronic device 1. Since the electrical connection device 10 of the uppermost electronic device 1 is set to STATE 1, the second lifting member 15 of the electrical connection device 10 of the uppermost electronic device 1 does not move.

Figure 9D:
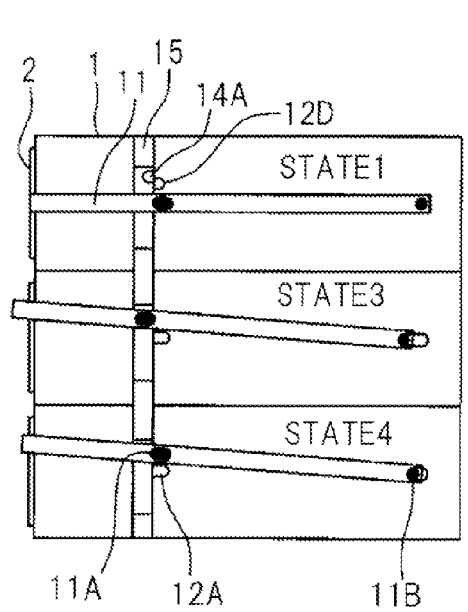
FIG. 9D is a side view illustrating a state in which the pivot lever of the lowermost electrical device is pushed back so as to change the state to STATE 4 from the state illustrated in FIG. 9C in the electrical connection procedure for interconnecting the stacked three electronic devices.

FIG. 9C illustrates a state in which all of the three electronic devices 1 are electrically connected to each other using the electrical connection devices 10. In order to prevent this state from being changed, as illustrated in FIG. 9D, the pivot lever 11 of the electrical connection device 10 of the lowermost electronic device 1 is pushed into the electrical connection device 10 so as to set the electrical connection device 10 to STATE 4. Thus, all of the three electronic devices 1 are electrically connected to each other and secured to each other using the electrical connection devices 10. As described above, when the electrical connection devices 10 of the present application are used, electrical connection between the stacked electronic devices 1 may be easily performed on the front surface side of the electronic devices 1.

Figure 10A:
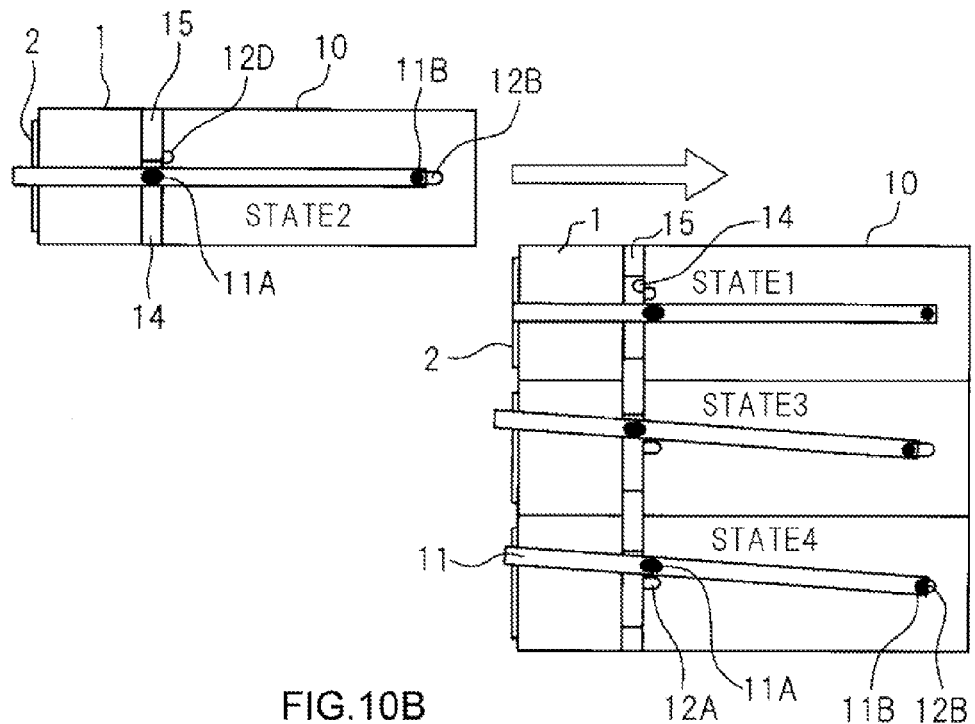
FIG. 10A is a side view illustrating a case in which an additional electronic device is stacked on top of and electrically connected to the three stacked electronic devices illustrated in FIG. 9D.

Referring next to FIGS. 10A to 12B, a case is described, in which, when all of the electronic devices 1 each provided with the electrical connection device 10 of the present application are stacked one on top of the other and electrically connected to each other, the other electronic device 1 provided with the electrical connection device 10 of the present application is stacked on top of the already stacked electronic devices 1 and electrically connected to the already stacked electronic devices 1. FIG. 10A illustrates a case in which the additional electronic device 1 is stacked on top of and electrically connected to the already stacked three electronic devices 1 illustrated in FIG. 9D. The additional electronic device 1 is set to STATE 2 in the present example.

Figure 10B:
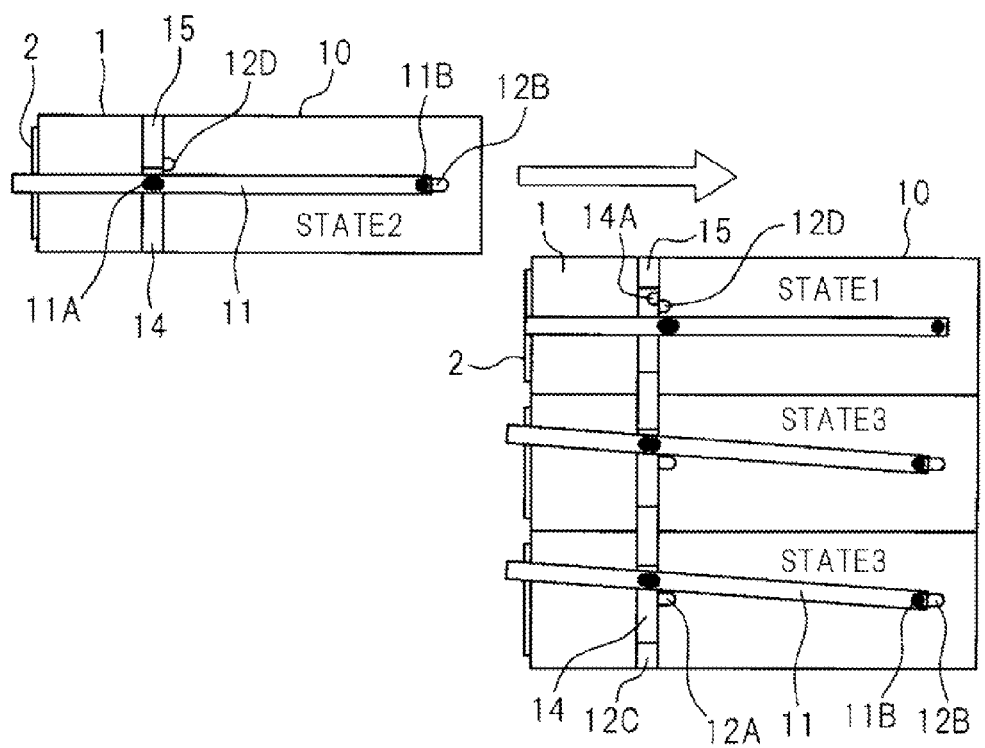
FIG. 10B is a side view illustrating a state in which the pivot lever of the lowermost electronic device illustrated in FIG. 9A is returned from STATE 4 to STATE 3.
Figure 11A:
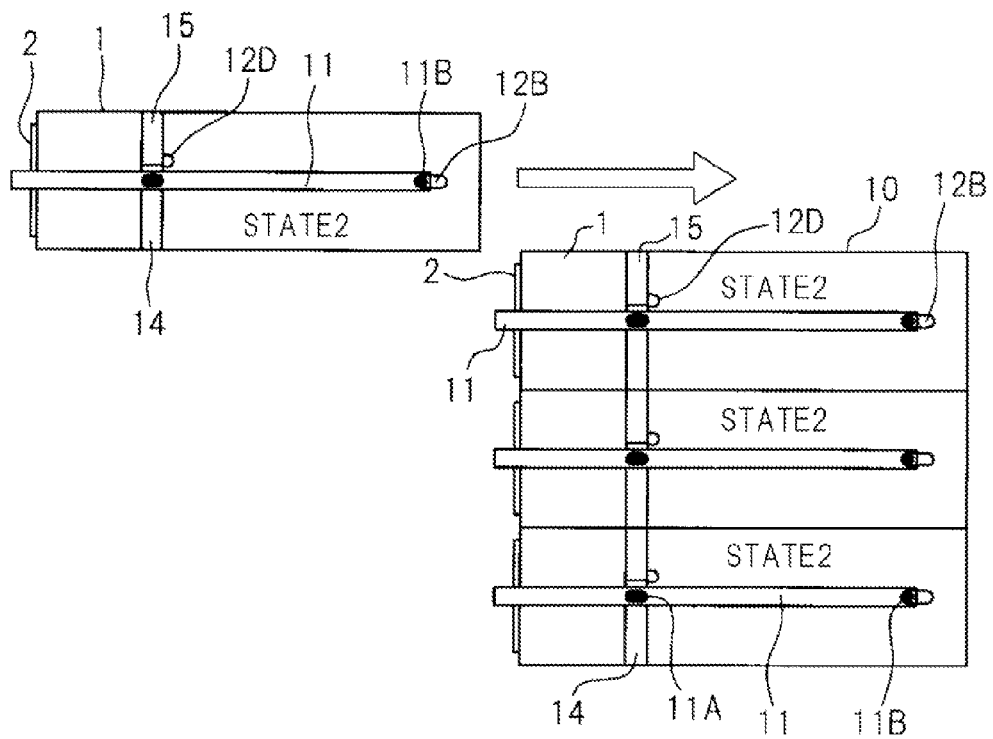
FIG. 11A is a side view illustrating a state in which all the pivot levers of the three electronic devices illustrated in FIG. 10B are returned to STATE 2.
Figure 11B:
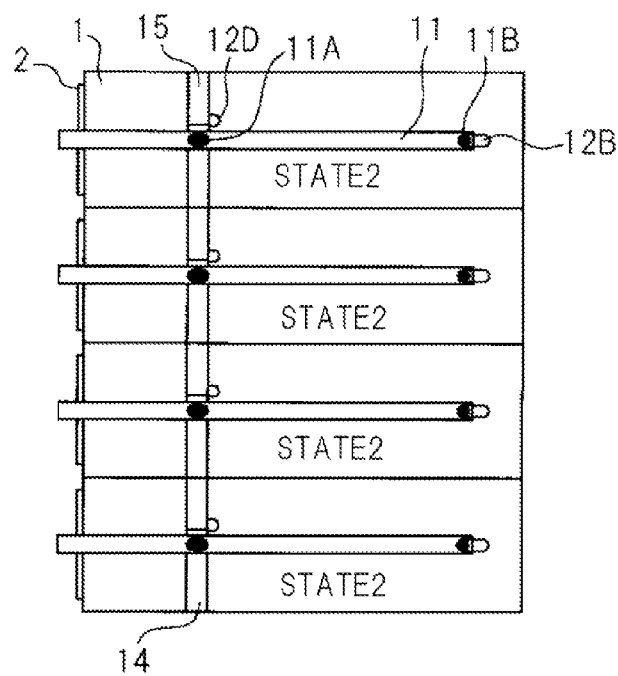
FIG. 11B is a side view illustrating a state in which the additional electronic device in STATE 2 is stacked on top of the three stacked electronic devices illustrated in FIG. 11A.
Figure 12A:
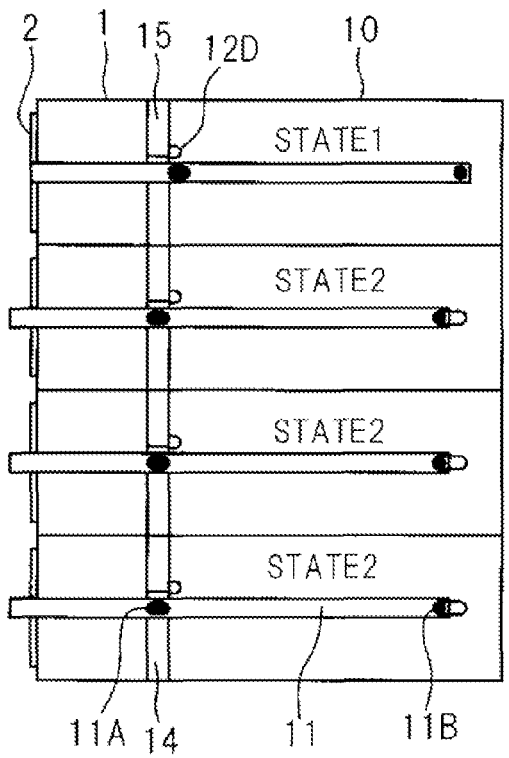
FIG. 12A is a side view illustrating a state in which the pivot lever of the electronic device at the uppermost location of the four stacked electronic devices illustrated in FIG. 11B is returned to STATE 1.
Figure 12B:
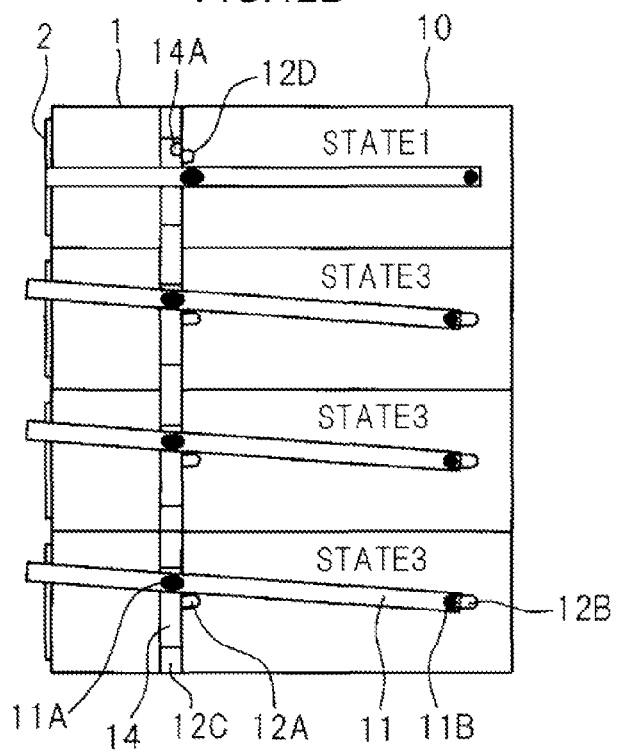
FIG. 12B is a side view illustrating a state of the upper three electronic devices when the pivot lever of the lowermost electronic device is pulled frontward so as to change the state of the lowermost device to STATE 3 from the state illustrated in FIG. 12A.

In this case, as illustrated in FIG. 10B, the pivot lever 11 of the lowermost electronic device 1 is initially pulled frontward so as to change the state from STATE 4 into STATE 3. Next, as illustrated in FIG. 11A, the electrical connection device 10 of each of the three stacked electronic devices 1 is set to STATE 2. Then, the additional electronic device 1, the electrical connection device 10 of which is set to STATE 2, is stacked on top of the three stacked electronic device 1. Thus, the electrical connection device 10 of each of the four stacked electronic devices 1 is set to STATE 2. After that, as illustrated in FIG. 12A, the pivot lever 11 of the electrical connection device 10 of the uppermost electronic device 1 is pushed into the electrical connection device 10 so as to set the electrical connection device 10 to STATE 1. Then, by turning upward the pivot lever 11 of the electrical connection device 10 of the lowermost electronic device 1, the state illustrated in FIG. 9C is achieved with the four electronic devices as illustrated as FIG. 12B. Finally, by pushing the pivot lever 11 of the electrical connection device 10 of the lowermost electronic device 1 into the electrical connection device 10 so as to set the electrical connection device 10 to STATE 4. Thus, all of the four electronic devices 1 are electrically connected to each other and secured to each other using the electrical connection devices 10.

As described above, when the electrical connection devices 10 of the present application are used, electrical connection between all of the electronic devices 1 may be easily performed from the front surface side of the electronic devices 1 in a case in which the additional electronic device 1 is stacked on top of the already stacked electronic devices 1. In addition, by setting the electrical connection device 10 of one of the intermediate electronic devices 1 out of the stacked multiple electronic devices 1 to STATE 1, internal circuitry of the electronic device 1, the electrical connection device 10 of which is set to STATE 1, may be separated from internal circuitry of the electronic device 1 disposed above it.

Figure 13A:
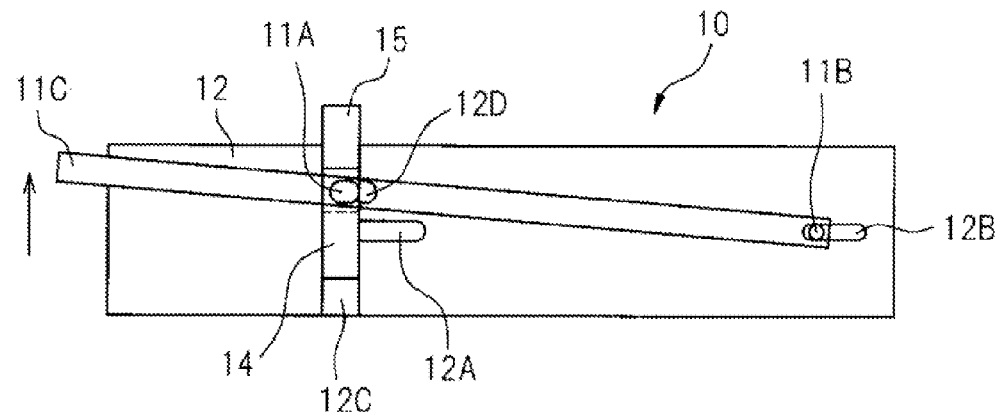
FIG. 13A is an explanatory view of a fulcrum, a force point, and an action point of the pivot lever of the electrical connection device according to the first embodiment.
Figure 13B:
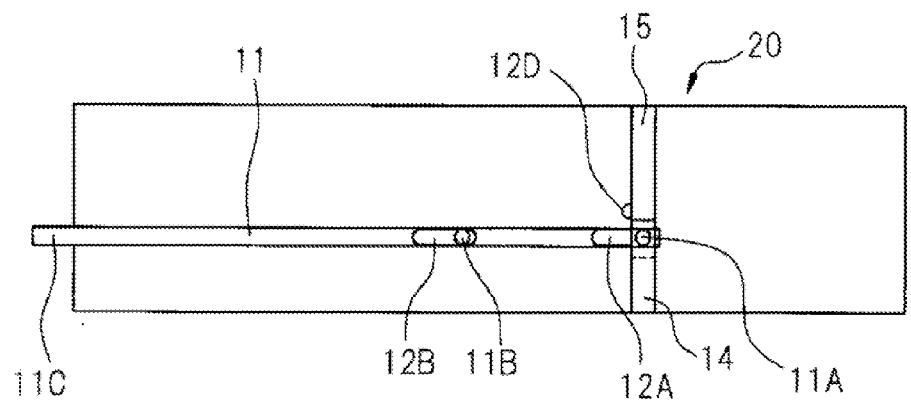
FIG. 13B is a side view explaining a fulcrum, a force point, and an action point of a pivot lever of the electrical connection device mounted on the electronic device according to a second embodiment.
Figure 13C:
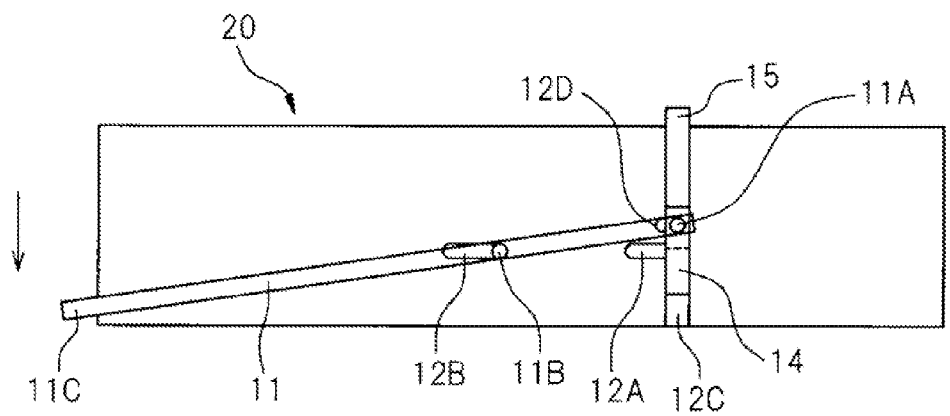
FIG. 13C is a side view illustrating a state in which the pivot lever is operated so as to operate the electrical connection device from the state illustrated in FIG. 13B.

In the above described example, as illustrated in FIG. 13A, the pivot lever 11 of the electrical connection device 10 has the fulcrum at the pin 11B on the rear surface side thereof, the action point at the pin 11A provided at the intermediate point thereof, and the force point at the proximal end portion 11C thereof. As a second embodiment different from the above example, an electrical connection device 20 may be realized, in which, as illustrated in FIG. 13B, the pivot lever 11 has the action point at the pin 11A on the rear surface side thereof, the fulcrum at the pin 11B provided at the intermediate point thereof, and the force point at the proximal end portion 11C thereof. In the electrical connection device 20 of the second embodiment, as illustrated in FIG. 13C, in order to move the second lifting member 15 upward at the action point, the proximal end portion 11C of the pivot lever 11 is turned downward that is a direction opposite the direction in the first embodiment.

Figure 14:
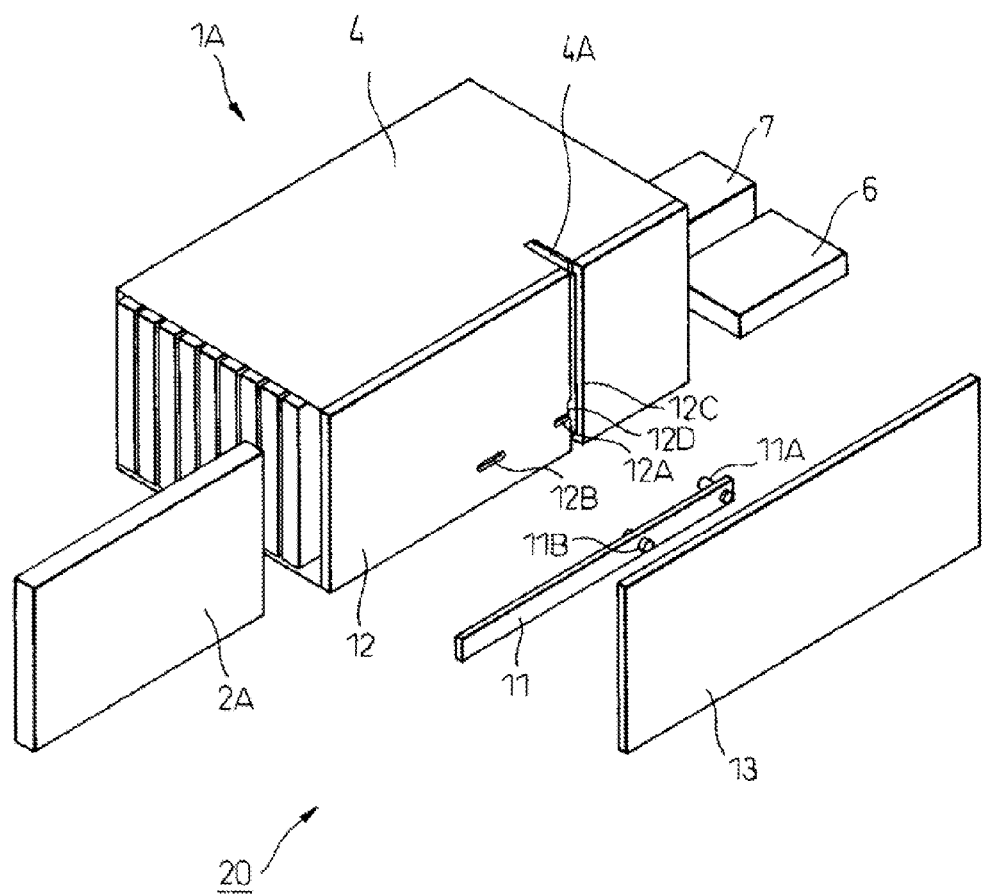
FIG. 14 is an assembly perspective view illustrating the structure of an example of the electronic device on which the electrical connection device is mounted according to the second embodiment.

The electrical connection device 20 of the second embodiment uses the same components as those of the first embodiment with only the positions of the fulcrum and the action point on the pivot lever 11 switched to each other compared to the electrical connection device 10 of the first embodiment. Thus, the same components are denoted by the same signs and descriptions thereof are omitted. FIG. 14 illustrates a specific structure of an electronic device 1A including the electrical connection device 20 according to the second embodiment. The electrical connection device 20 of the second embodiment is advantageous when a hard disk drive 2A is long in the front-rear direction.

Figure 15A:
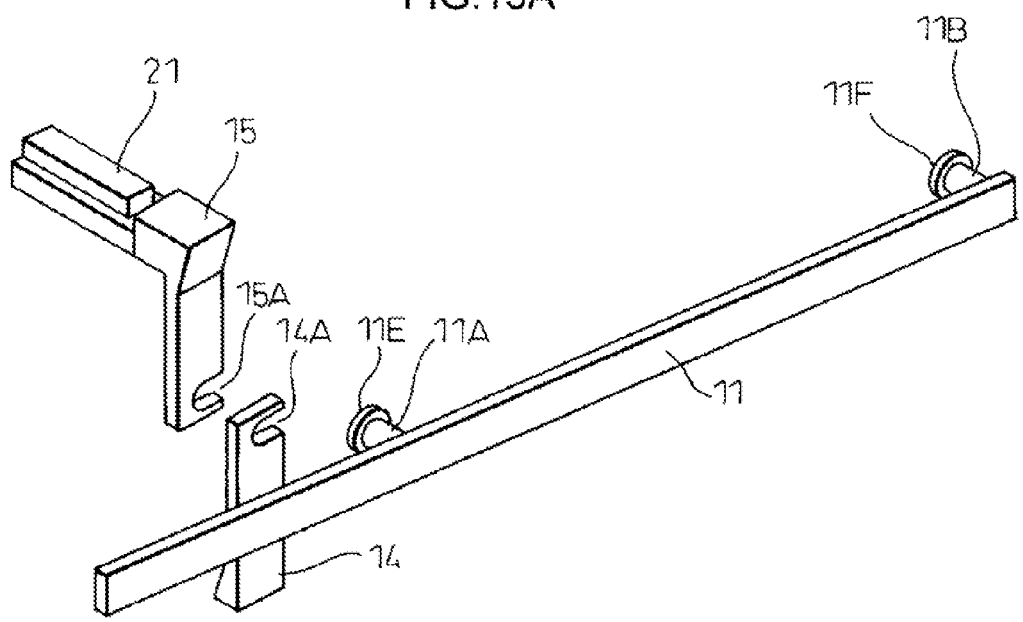
FIG. 15A is a perspective view illustrating alternative embodiment of the pivot lever.
Figure 15B:
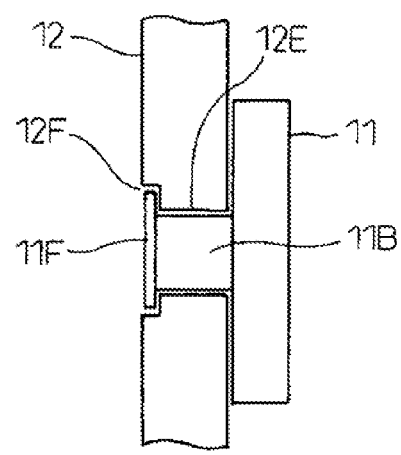
FIG. 15B is a sectional view illustrating the structure of an inner plate corresponding to the pivot lever illustrated in FIG. 15A.

In the above-described example, the pivot lever 11 is disposed between the inner plate 12 and the outer plate 13. Alternatively, as illustrated in FIGS. 15A and 15B, flanges 11E and 11F may be provided at the ends of the pins 11A and 11B of the pivot lever 11, respectively. In this case, the second horizontal groove 12B may be made to be, for example, a through groove 12E with a recess 12F formed on a side of the through groove 12E opposite the pivot lever 11 side so as to receive the flange 11F. By doing this, the inner surface of the outer plate 13 may have a flat surface.

In the above-described examples, the female connector 22 is mounted on the backplane 5 provided in the electronic device 1 or 1A. However, the mounting position of the female connector 22 is not limited to the backplane 5. The female connector 22 may be mounted in a portion near a side of the enclosure of the electronic device 1 or 1A. In the above-described examples, the electrical connection device 10 or 20 is mounted on the right side surface of the electronic device 1 or 1A. However, the electrical connection device 10 or 20 may be mounted on the left side surface of the electronic device 1 or 1A.

The inner plate 12 may be a side plate the upper enclosure 4 of the electronic device 1 or 1A.

According to the electric connection device 10 or 10A for interconnecting the electronic devices 1 or 1A of the present application, by pulling frontward and pivoting the pivot lever 11 that is provided along a side surface of the enclosure 4, the male connector 21 protrudes from the opening 4A of the upper enclosure 4 so as to be connected to the female connector 22 of the other electronic device 1 or 1A disposed above. As a result, the electronic devices 1 or 1A stacked in the up-down direction may be electrically connected to each other without cables. By setting the pivot lever 11 of the uppermost electronic device 1 or 1A to a state in which the pivot lever 11 is not pulled frontward, the uppermost male connector 21 does not protrude from the upper enclosure 4, thereby maintaining the upper surface of the uppermost upper enclosure 4 flat. In addition, by setting the pivot lever 11 of the intermediate electronic device 1 or 1A to a state in which the pivot lever 11 is not pulled frontward, this intermediate electronic device 1 or 1A may be unconnected from the electronic device 1 or 1A disposed immediately above it.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. An electronic device comprising:
   an enclosure configured to house a circuit board, the enclosure having a first opening of an upper portion thereof and a second opening of a lower portion thereof;
   a side-plate configured to extend horizontally along a side surface of the enclosure, the side plate including a first horizontal guide having a non-operating position and an operating position, a second horizontal guide having a non-operating position and an operating position, and a vertical guide extending vertically from the operating position of the first horizontal guide;
   a pivot lever configured to extend horizontally along the side plate, the pivot lever having a fulcrum, an action point and a force point, the fulcrum being engaged with the second horizontal guide and being movable between the non-operating position and operating position of the second horizontal guide in a horizontal direction, the action point being engaged with the first horizontal guide and being movable between the non-operating position and operating position of the first horizontal guide in a horizontal direction, the force point being positioned at one end portion of the pivot lever;
   a lifter configured to be movable upward and downward along the vertical guide, the lifter being engaged with the action point of the pivot lever on the occasion that the action point of the pivot lever is moved to the operating position of the first horizontal guide and the fulcrum of the pivot lever is moved to the operating position of the second horizontal guide;
   a first connector configured to be disposed at an upper portion of the lifter and to be connected to the circuit board, the first connector moving upward to protrude from the first opening of the enclosure upon the pivot lever being engaged with the lifter and being pivoted from a horizontal position to move up the lifter; and
   a second connector configured to be disposed to expose at the second opening of the enclosure and to be connected to the circuit board, the second connector being connected to a first connector that is protruded from an enclosure of another electronic device, which has a structure the same as that of the electronic device, disposed immediately below the electronic device.

2. The electronic device according to claim 1,
wherein the first and second horizontal guides are first and second grooves, respectively, and the vertical guide is a vertical groove,
wherein the pivot lever includes a first pin that protrudes at the action point of the pivot lever and a second pin that protrudes at the fulcrum of the pivot lever, the first and second pins being movable in the first and second grooves, respectively,
wherein the lifter includes a first lifting member and a second lifting member, the second lifting member on which the first connector being mounted, the second lifting member being disposed adjacent to the first lifting member,
wherein the first lifting member has a recess formed in an upper portion thereof and the second lifting member has a recess formed in a lower portion thereof, the recesses being engaged with the first pin provided at the action point of the pivot lever on the occasion that the action point of the pivot lever is moved to the operating position of the first groove and the fulcrum of the pivot lever is moved to the operating position of the second groove,
wherein, on the occasion that the action point of the pivot lever is moved to the non-operating position of the first groove and the fulcrum of the pivot lever is moved to the non-operating position of the second groove, the first lifting member is movable in the vertical groove and the second lifting member is not movable in the vertical groove and
wherein, a lower surface of the first lifting member is disposed so as to face an upper surface of a second lifting member of another electronic device, which has a structure the same as that of the electronic device, disposed immediately below the electronic device.

3. The electronic device according to claim 1,
wherein the circuit board and the first connector are connected to each other with a flexible cable having an extra length.

4. The electronic device according to claim 1,
wherein the pivot lever has the fulcrum at a position adjacent to a rear surface of the electronic device and the action point at a position between the fulcrum and the force point.

5. The electronic device according to claim 1,
wherein the pivot lever has the action point at a position adjacent to a rear surface of the electronic device and the fulcrum at a position between the action point and the force point.

6. The electronic device according to claim 2,
wherein a lock groove is provided in the vertical groove at a position where pivoting of the pivot lever ends, the lock groove locking the first pin provided at the action point of the pivot lever therein.

7. The electronic device according to claim 2,
wherein a flange is provided at an end of the first pin that is engaged with the first horizontal groove, the flange preventing the pivot lever from moving away from the side plate.

8. The electronic device according to claim 2
wherein a cover is mounted at a position outside the pivot lever, the cover protecting the pivot lever.

9. The electronic device according to claim 2,
wherein the first and second pins that are provided at the action point and fulcrum of the pivot lever, respectively, and also protrude toward a side opposite the side plate, the first and second pins coaxially protruding from both sides of the pivot lever,
wherein a cover is mounted at a position outside the pivot lever, the cover protecting the pivot lever and having respective grooves that face the first and second grooves and the vertical groove across the pivot lever, the grooves of the cover receiving the first and second pins.

10. The electronic device according to claim 2,
wherein a lower side of the first lifting member bulges so as to increase the area of the lower surface of the first lifting member,
wherein an upper side of the second lifting member bulges so as to increase the area of the upper surface of the second lifting member.

11. The electronic device according to claim 2,
wherein, on the occasion that the second lifting member of another electronic device, which is disposed immediately below the electronic device and has a structure the same as that of the electronic device, is moved up to push the first elevating member of the electronic device upward, the first connector disposed on the second lifting member of the electronic device moves up to protrude from the first opening of the enclosure by movement of the first lifting member of the electronic device on the occasion that the action point of the pivot lever is engaged with the first lifting member and the second lifting member.

12. The electronic device according to claim 2,
wherein, on the occasion that second lifting member of another electronic device, which is disposed immediately below the electronic device and has a structure the same as that of the electronic device, is moved up to push the first elevating member of the electronic device upward, the second lifting member of the electronic device does not moves up by movement of the first lifting member of the electronic device on the occasion that the action point of the pivot lever is not engaged with the first lifting member and the second lifting member.

13. The electronic device according to claim 1,
wherein the circuit board is a backplane that is disposed at a front side of the electronic device,
wherein a plurality of connectors are mounted on a side of the backplane close to front surface of the electronic device, the plurality of connectors being connected to a plurality of hard disk drives,
wherein a control unit and a power supply unit are disposed at a position adjacent to the rear surface of the electronic device, the control unit writing information to and reading information from the hard disk drives.

14. The electronic device according to claim 1,
wherein the side plate of the electronic device is a side plate of the enclosure.

15. The electronic device according to claim 2, wherein
the first connector of the electronic device and the second lifting member of the electronic device protrude from the first opening of the enclosure when the first lifting member of the electronic device is raised by a second lifting member of the another electronic device disposed immediately below the electronic device after the first pin of the pivot lever is engaged with the recesses of the first and second lifting members, and
the first connector of the electronic device and the second lifting member of the electronic device do not protrude from the first opening of the enclosure when the first lifting member of the electronic device is raised by the second lifting member of the another electronic device disposed immediately below the electronic device upon the first pin of the pivot lever being in the non-operating position of the first groove.

16. An electrical connection device for interconnecting electronic devices stacked vertically, the electrical connection device comprising:
- a side-plate configured to extend horizontally along a side surface of an enclosure of each of the electronic devices, the side plate including a first horizontal guide having a non-operating position and an operating position, a second horizontal guide having a non-operating position and an operating position, and a vertical guide extending vertically from the operating position of the first horizontal guide;
- a pivot lever configured to extend horizontally along the side plate, the pivot lever having a fulcrum, an action point and a force point, the fulcrum being engaged with the second horizontal guide and being movable between the non-operating position and operating position of the second horizontal guide in a horizontal direction, the action point being engaged with the first horizontal guide and being movable between the non-operating position and operating position of the first horizontal guide in a horizontal direction, the force point being positioned at one end portion of the pivot lever;
- a lifter configured to be movable upward and downward along the vertical guide, the lifter being engaged with the action point of the pivot lever on the occasion that the action point of the pivot lever is moved to the operating position of the first horizontal guide and the fulcrum of the pivot lever is moved to the operating position of the second horizontal guide, the lifter having a protrusion for mounting a connector of each of the electronic devices at an upper portion thereof, wherein the pivot lever is engaged with the lifter and is pivoted from a horizontal position to move up the lifter.

\* \* \* \* \*